United States Patent [19]
Maydan et al.

[11] Patent Number: 5,643,394
[45] Date of Patent: Jul. 1, 1997

[54] GAS INJECTION SLIT NOZZLE FOR A PLASMA PROCESS REACTOR

[75] Inventors: Dan Maydan, Los Altos Hills; Steve S. Y. Mak, Pleasanton; Donald Olgado, Mountain View; Gerald Zheyao Yin, Cupertino, all of Calif.; Timothy D. Driscoll, Hamilton, Mont.; Brian Shieh, Hualien, Taiwan; James S. Papanu, San Rafael, Calif.

[73] Assignee: Applied Materials, Inc., Santa Clara, Calif.

[21] Appl. No.: 307,888

[22] Filed: Sep. 16, 1994

[51] Int. Cl.⁶ .................................................. H05H 1/00
[52] U.S. Cl. ................. 156/345; 118/723 R; 118/723 E; 204/298.07; 204/298.33
[58] Field of Search ...................... 156/345; 204/298.33, 204/298.07; 118/715, 723 R, 723 E, 723 ER

[56] References Cited

U.S. PATENT DOCUMENTS

| | | |
|---|---|---|
| 4,512,283 | 4/1985 | Bonifield et al. |
| 4,612,077 | 9/1986 | Tracy et al. ..................... 204/298.33 X |
| 4,993,358 | 2/1991 | Mahawili ........................ 118/715 |
| 5,000,113 | 3/1991 | Wang et al. .................... 118/715 X |
| 5,024,748 | 6/1991 | Fujimura ........................ 204/298.33 X |
| 5,074,456 | 12/1991 | Degner et al. ................ 156/345 X |
| 5,376,213 | 12/1994 | Ueda et al. .................... 156/345 |

FOREIGN PATENT DOCUMENTS

| | | |
|---|---|---|
| 0090586 | 10/1983 | European Pat. Off. . |
| 0552491 | 7/1993 | European Pat. Off. . |
| 202733 | 12/1982 | Japan . |
| 67922 | 4/1986 | Japan . |
| 123721 | 6/1987 | Japan . |
| 61078 | 3/1990 | Japan . |
| 294029 | 12/1990 | Japan . |
| 188627 | 8/1991 | Japan . |

Primary Examiner—Thi Dang
Attorney, Agent, or Firm—Michaelson & Wallace

[57] ABSTRACT

The invention is embodied in a gas injection apparatus for injecting gases into a plasma reactor vacuum chamber having a chamber housing, a pedestal holding a workpiece to be processed, means for applying RF energy into the chamber, the gas injection apparatus having a gas supply containing an etchant species in a gas, an opening in the chamber housing, a gas feed line from the supply to the opening in the chamber housing, and gas distribution apparatus near the opening in the chamber housing, the gas feed apparatus having at least one slit nozzle facing the interior of the chamber. In a preferred embodiment, the gas distribution apparatus includes a disk member surrounded by at least one annular member with a gap therebetween comprising the slit nozzle, the disk member and annular member blocking gas flow through the opening in the chamber housing. Preferably, each of the members of the gas distribution apparatus comprises a material at least nearly impervious to attack from the etchant species. In one example, each of the members of the gas distribution apparatus comprises one of ceramic, quartz, sapphire, polyimide or anodized aluminum and the gas feed line comprises stainless steel. Preferably, each of the members has its surface polished prior to assembly of the gas distribution apparatus.

73 Claims, 10 Drawing Sheets

GAS INJECTION SLIT NOZZLE FOR A PLASMA PROCESS REACTOR

BACKGROUND OF THE INVENTION

1. Technical Field:

The invention is related to plasma reactors for processing semiconductor integrated circuit wafers and specifically to improvements in the gas injection and distribution apparatus employed in such reactors.

2. Background Art:

A plasma reactor for processing semiconductor integrated circuit wafers, such as a metal etch reactor, typically includes a vacuum chamber, a pedestal for supporting the wafer in the chamber, a plasma RF power source and a gas injection source for supplying gases through the top of the chamber and a gas distribution plate near the chamber ceiling for distributing the incoming gases in a uniform manner. If the reactor is an inductively coupled reactor, then it can include a coil antenna around the chamber connected to the plasma RF power source, and the wafer pedestal can be connected to a bias RF power source. In other types of plasma reactors (such, for example, a reactive ion etch reactor), there is no coil antenna and the plasma RF power source is connected to the wafer pedestal. For plasma etch processes, the incoming gas includes an etchant species such as chlorine and/or boron tri-chloride, for example. The gas distribution plate is typically a flat plate covering the reactor chamber ceiling about 100–150 mils thick with about one hundred holes or orifices therethrough, each hole being no more than about 20–30 mils in diameter in order to prevent penetration of the plasma into the holes. The backside or top surface of the gas distribution plate is coupled to a gas injection source or port which extends through the chamber top or lid while the front side faces downwardly toward the chamber interior and the wafer.

The gas distribution plate must be fairly large to provide a reasonably uniform gas distribution within the chamber and to provide a means of controlling the electrical potential at the top of the reactor chamber. Typically, the gas distribution plate is a ground plane. For this purpose, the gas distribution plate must be made of a conductive material such as aluminum.

The basic problem with such a gas distribution plate is that it is subject to corrosion from the gases introduced through it into the reactor chamber. The gas distribution plate front surface is directly exposed to the plasma within the chamber and is therefore susceptible to attack therefrom. The gas distribution plate back surface is coupled to the gas supply inlet and the gases contacting the back surface are at a relatively high pressure due to the back pressure caused by the small size of the orifices or holes through the gas distribution plate. This high back pressure increases the rate at which the gas distribution plate back surface is corroded. In order to minimize such corrosion, the gas distribution plate is anodized to provide an aluminum oxide film on its surface. Unfortunately, in etch reactors employing mixtures of chlorine and boron tri-chloride gases, the boron tri-chloride etches the anodized surface (the aluminum oxide film) while the chlorine etches the aluminum underneath to undermine the aluminum oxide film.

Such problems are particularly acute at the orifices or holes through the gas distribution plate. In order to prevent a plasma glow from forming in the holes and behind the plate, the diameters of these holes cannot exceed the plasma sheath thickness, which is approximately 20–30 mils. Such small holes must be either drilled mechanically or by a laser, either of which forms a hole with sharp edges and roughens the interior surface of each hole. The sharp edges around each hole and the rough interior surfaces of each hole are eroded by the flow of chlorine and tri-chloride gases. If the gas distribution plate is anodized, cracks in the anodization are difficult to avoid at the sharp edges of the holes. At these edges, the anodization is susceptible to erosion due to gas flow and corrosion due to penetration of etchant gases into the anodization cracks and etching of the underlying aluminum. All such erosion and corrosion creates particle contamination which can lead to fatal defects in the integrated circuits on the wafer being processed in the chamber. In an effort to reduce such problems, the gas distribution plate hole edges may be routed and the hole interior surfaces and edges may be honed with a diamond powder. However, such efforts merely reduce the magnitude of the problem but do not solve the problem.

In view of the foregoing problems, one limitation of such plasma reactors has been that the gas distribution plate typically can only be used for two complete process cycles of the reactor, a new gas distribution plate being required thereafter. (The term "process cycle" as used herein refers to the time between successive chamber cleaning operations.) This avoids many of the foregoing problems but greatly increases the unproductive "down" time and capital costs or expenditures incurred while operating such a plasma reactor. Furthermore, enhanced corrosion of the top or lid behind (or above) the gas distribution plate is often observed.

Another problem with such reactors, particularly etch reactors, is that the etch rate near the wafer periphery is much greater than the etch rate near the wafer center. This is due at least in part to the fact that the etchant species are being consumed at a maximum rate near the wafer and may therefore be scarce in the region near the wafer center, while little or no consumption of etchant species occurs beyond the edge of the wafer so that a plentiful supply of etchant species exists just beyond the wafer periphery capable of sustaining very high etch rates near the wafer periphery. The etch rate across the wafer diameter may be rendered less non-uniform by providing for a greater gas flow through the gas distribution plate over the wafer center and a lesser gas flow over the wafer periphery. This is accomplished by providing more orifices or holes per unit area in the gas distribution plate over the wafer center and less over the wafer periphery. Etch rate uniformity across the wafer diameter to within 5 percent has been achieved, and is satisfactory.

One technique for further enhancing the uniformity of the etch rate across the wafer diameter is to provide a so-called focus ring, which may be an annular vertical high wall up to several centimeters in height surrounding the wafer periphery. This wall or focus ring stops or retards the replenishment of etchant species at the wafer periphery.

SUMMARY OF THE INVENTION

The invention is provided in a gas injection apparatus for injecting gases into a plasma reactor vacuum chamber having a chamber housing, a pedestal holding a workpiece to be processed, means for applying RF energy into the chamber, the gas injection apparatus having a gas supply containing an etchant species in a gas, an opening in the chamber housing, a gas feed line from the supply to the opening in the chamber housing, and gas distribution apparatus near the opening in the chamber housing, the gas feed apparatus having at least one slit nozzle facing the interior of the chamber. In a preferred embodiment, the gas distribution apparatus includes a disk member surrounded by at least one annular member with a gap therebetween comprising the slit nozzle, the disk member and annular member blocking gas flow through the opening in the chamber housing. Preferably, each of the members of the gas distribution apparatus comprises a material at least nearly impervious to attack from the etchant species. In one example, each of the members of the gas distribution apparatus comprises ceramic and the gas feed line comprises stainless steel. Preferably, each of the members has its surface polished prior to assembly of the gas distribution apparatus.

DETAILED DESCRIPTION OF THE PREFERRED EMBODIMENTS

The invention replaces the conventional flat gas distribution plate (i.e., a showerhead or perforated plate) having plural gas injection orifices therethrough near the chamber ceiling. The invention is a gas distribution apparatus in or on the chamber lid or ceiling. In a first embodiment of the invention illustrated in FIG. 1A, the reactor chamber top wall or lid 10 has a gas injection passage 15 therethrough. A disk-shaped blocking plate 20a suspended and spaced from the lid 10 forms a circular slotted aperture or nozzle 25 between a circular ridge 20a' of the blocking plate 20a and the ceiling surface 10a of the chamber lid 10. In general, the blocking plate 20a is a solid symmetrical element having its axis of symmetry approximately centered with respect to the injection passage 15 so as to uniformly disperse the gas flowing from the injection passage 15. The blocking plate 20a is sufficiently close to the lid 10 so that the aperture 25 is a long thin and preferably continuous opening. A symmetrical annular reflector 35a attached to the ceiling surface 10a is centered relative to and surrounds the plate 20a so as to focus the gas injected through the circular aperture 25 toward the center of the chamber in order to enhance the etch rate near the wafer center.

Figure 1A:
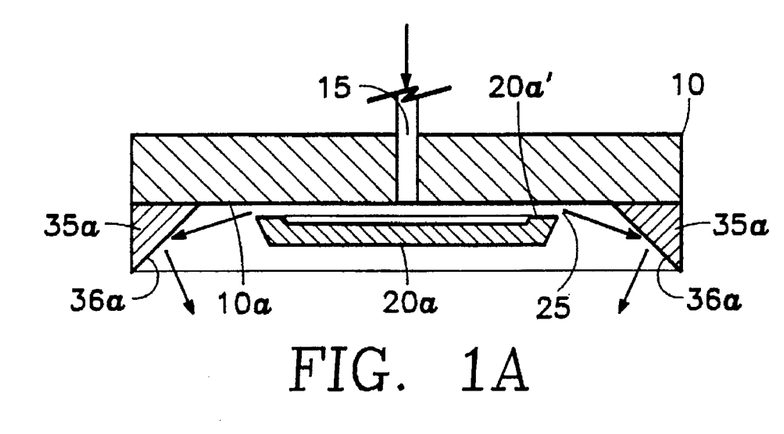
FIG. 1A is a cross-sectional view of the ceiling of a plasma reactor including a first embodiment of a gas distribution slotted nozzle of the present invention.
Figure 1B:
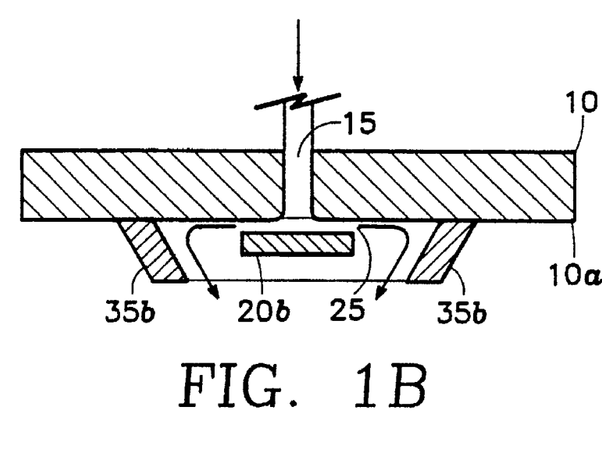
FIG. 1B is a cross-sectional view of the ceiling of a plasma reactor including a second embodiment of a gas distribution slotted nozzle of the present invention.

In a second embodiment illustrated in FIG. 1B, the size of the entire gas injection apparatus is reduced by employing the disk-shaped blocking plate 20b of reduced diameter and employing the annular reflector 35b of reduced diameter. In the embodiment of FIG. 1A, the annular reflector 35a has an inner surface 36a disposed at an obtuse angle relative to the blocking plate 20a, while in the embodiment of FIG. 1B the annular reflector 35b has an inner surface 36b disposed at an acute angle relative to the blocking plate 20 for greater focusing of the injected gases toward the wafer center. In the embodiments of FIGS. 1A and 1B, the gas injection port 15 is centered with respect to the chamber and lid 10.

Figure 1C:
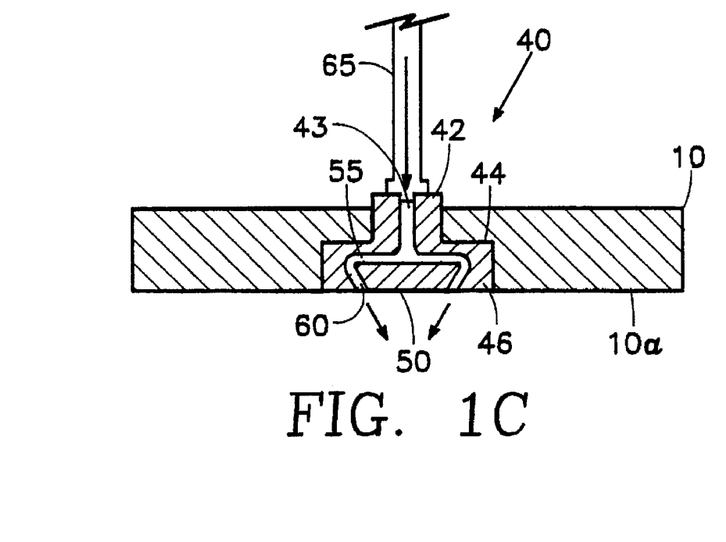
FIG. 1C is a cross-sectional view of the ceiling of a plasma reactor including a third embodiment of a gas distribution slotted nozzle of the present invention.

A third embodiment of the invention is illustrated in FIG. 1C. In this embodiment, the entire gas injection apparatus is contained within the lid 10 and consists of a gas passage liner 40 including a cylindrical upper liner 42 forming a cylindrical top passage 43, an annular intermediate liner 44 extending radially outwardly from the base of the cylindrical upper liner 42, and an inverted truncated conical annular bottom liner 46 extending from the edge periphery of the annular intermediate liner 44 to the ceiling surface 10a of the lid 10. An inverted truncated conical center disk 50 is fastened in place in the interior space surrounded by the bottom liner 46 and is congruent therewith. The disk 50 is spaced from the intermediate liner 44 to form a horizontal flat disk-shaped gas manifold 55. Furthermore, the disk 50 is spaced from the bottom liner 46 to form a conical annular shaped slotted aperture 60 which serves as the gas injection nozzle. The conical angle at which the slotted aperture 60 is disposed does not necessarily have to be the angle depicted in FIG. 1C. It is selected to provide an optimum uniform distribution of etch rate across the wafer surface. For example, the angle can be selected to bias the gas distribution toward the center of the wafer to compensate for the usual tendency of plasma etch processes to have a lower etch rate at the center of the wafer. Overall, process conditions and hardware parameters in addition to the nozzle design impact etch rate uniformity, so the slotted aperture 60 can be vertical (as in the embodiment of FIG. 1D referenced below) or angled inwardly or angled outwardly with respect to its central axis.

Figure 1D:
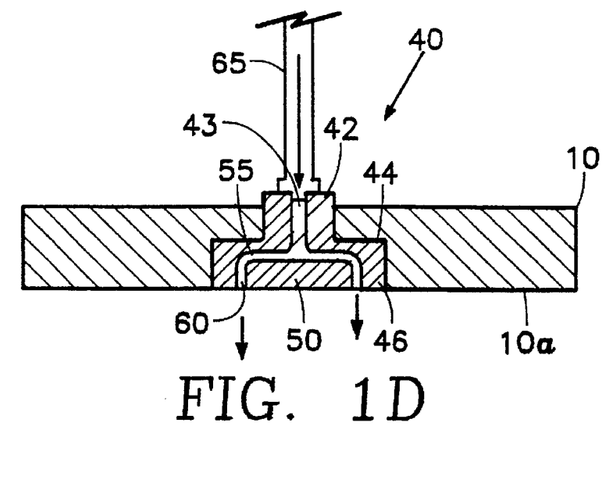
FIG. 1D is a cross-sectional view of an embodiment corresponding to FIG. 1C but having a vertical slotted nozzle.

FIG. 1D illustrates a fourth embodiment, which is identical to the embodiment of FIG. 1C except that the slotted aperture is vertical and the annular bottom liner 46 and center disk 50 are cylindrical rather than conical. FIG. 1D is a preferred embodiment.

An advantage of the invention is that the interior surfaces of the nozzle passages, including the interior surfaces of the manifold 55 and the interior surface of the slotted aperture or nozzle 60, are free of surface defects and therefore are not subject to corrosion or erosion. This is because the liner 40, including its constituent elements 42, 44, 46, and the center disk 50 are manufactured and machined as separate pieces prior to assembly of the gas distribution apparatus. Thus, the interior surfaces are, during manufacturing, exterior surfaces of the separate pieces 40 (including 42, 44, 46) and 50. Accordingly, external polishing procedures are employed to achieve a defect-free smooth surface on each piece. This solves one aspect of the problem of contamination from erosion or corrosion of gas passage internal surfaces.

Another advantage of the invention is the small size or diameter of the gas distribution apparatus relative to the wafer diameter, particularly in the case of the preferred embodiment of FIG. 1D. Because of its small radial extent, the gas distribution apparatus, including the liner 40 and the center disk 50, need not be formed of a conductor material. As long as the lid 10 is a conductor, it is not necessary that the small gas distribution apparatus of FIG. 1D be a conductor to provide a ground plane at the top of the chamber. Therefore, it is preferable that the gas distribution apparatus including the liner 40 and the center disk 50 be formed of a material impervious to attack by the plasma or etchant species in the gas injected into the plasma. A preferred material is ceramic or an insulator such as quartz. As a result, the gases to be injected (such as chlorine or boron trichloride in the case of an etch reactor) never contact aluminum on their way into the reactor chamber. Specifically, the gas feed line 65 to the cylindrical injection passage 43 is stainless steel, so that the injected gases contact either the steel material of the gas feed line 65 or the quartz or ceramic material of the liner 40 and center disk 50. The foregoing features, including the external polishing of the liner 40 and center disk 50 surfaces and the use of materials such as ceramic or quartz, eliminate the problem of contamination due to corrosion and erosion of gas distribution materials.

Figure 2:
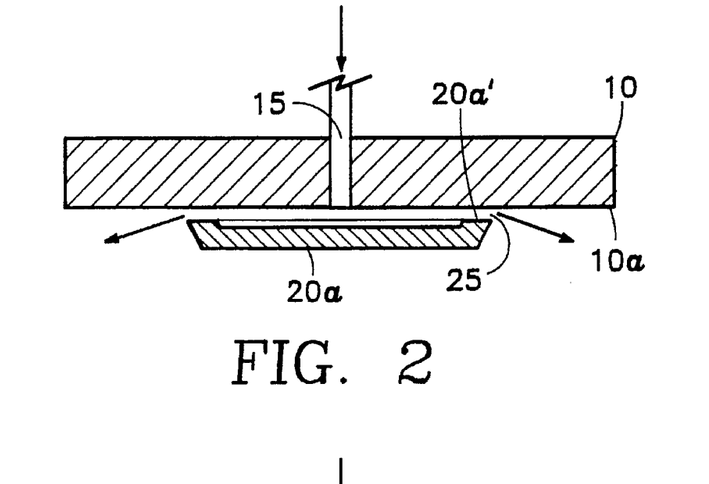
FIG. 2 is a cross-sectional view of the ceiling of a plasma reactor including a fourth embodiment of a gas distribution slotted nozzle of the present invention.

FIG. 2 illustrates an embodiment corresponding to FIG. 1A, but without the reflector 35a. The embodiment of FIG. 2 was found to provide a deviation in metal etch rate uniformity across a 200 mm diameter wafer surface not exceeding about 20%, uniformity being defined herein as [(max-min)/2*average].

Figure 3:
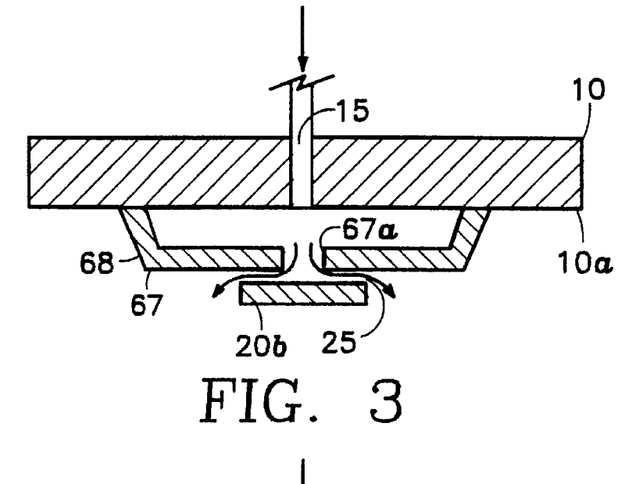
FIG. 3 is a cross-sectional view of the ceiling of a plasma reactor including a fifth embodiment of a gas distribution slotted nozzle of the present invention.

FIG. 3 illustrates a modification of the embodiment of FIG. 2 in which a disk-shaped injection manifold floor 67 having a center gas outlet 67a therethrough is attached to the bottom of the lid 10 by a truncated conical annulus 68. The blocking plate 20b (from FIG. 1B) faces the bottom of the gas outlet so as to uniformly disperse gases emanating from the gas outlet 67. The embodiment of FIG. 3 was found to provide a deviation in metal etch uniformity across the wafer surface not exceeding about 9%.

Figure 4A:
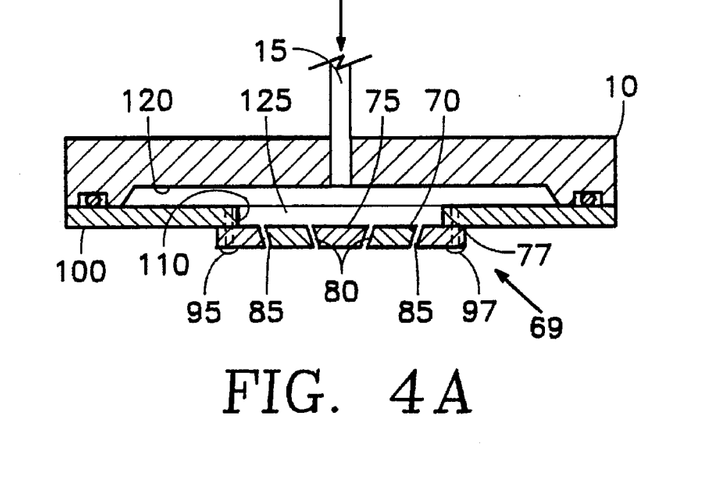
FIG. 4A is a cross-sectional view of the ceiling of a plasma reactor including a sixth embodiment of a gas distribution slotted nozzle of the present invention.
Figure 4B:
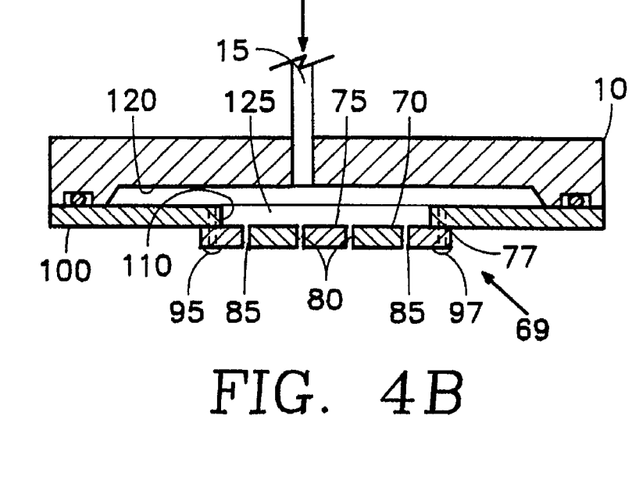
FIG. 4B is a cross-sectional view of an embodiment corresponding to FIG. 4A but having vertical slotted nozzles.
Figures 5, 6A:
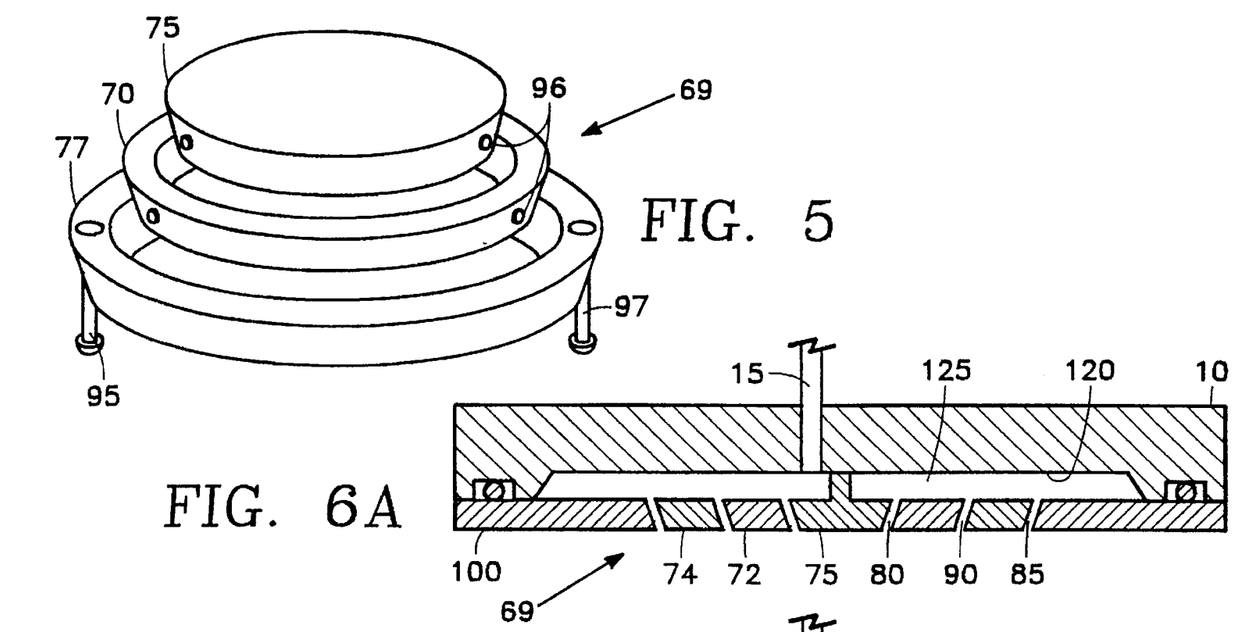
FIG. 5 is a perspective exploded view of a portion of the gas distribution slotted nozzle of FIG. 4A.
FIG. 6A is a cross-sectional view of the ceiling of a plasma reactor including a seventh embodiment of a gas distribution slotted nozzle of the present invention.

FIG. 4A illustrates another preferred embodiment of the invention having a blocking plate assembly 69 consisting of a parallelogramic annulus 70 and a smaller truncated conical center disk 75 (similar to the center disk 50 of FIG. 1C) within the annulus 70, and an outer annulus 77, forming two concentric circular slotted inwardly-angled apertures or nozzles 80, 85. FIG. 4B illustrates a modification to the embodiment of FIG. 4A in which the slotted apertures 80, 85 are vertical and the disk and annuli 75, 70, 77 are cylindrical. FIG. 5 illustrates the blocking plate assembly 69 of FIG. 4A prior to assembly at a point at which all of the interior gas nozzle passages are exterior surfaces of the separate pieces 70, 75, 77, which are polished separately for defect-free surfaces. The separate pieces 70, 75, 77 may be held together by radial spokes 96, the outer piece 77 being fastened by bolts 95, 97 to the lid 10, as will now be described. For this purpose, an injection manifold floor 100 is attached to the lid 10 about an opening 110 through the lid providing access to the passages 80, 85. A recessed ceiling 120 in the lid 10 and the injection manifold floor 100 form a gas injection manifold 125 over the passages 80, 85. The bolts 95, 97 are screwed into threaded holes in the floor 100.

Figure 6B:
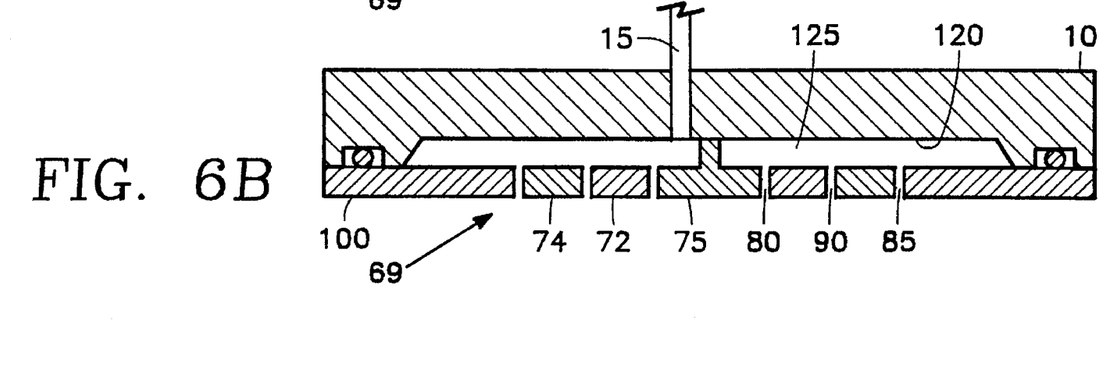
FIG. 6B is cross-sectional view of an embodiment corresponding to FIG. 6A but having vertical slotted apertures.

FIG. 6A illustrates an expansion of the concept of FIG. 4A in which the blocking plate assembly 69 is modified to include a pair of concentric parallelogramic annuli 72, 74, providing three circular slotted apertures or nozzles 80, 85, 90 angled inwardly toward the center. In this embodiment, all of the pieces are co-planar with the floor 100. FIG. 6B illustrates an embodiment corresponding to FIG. 6A but having vertical slotted apertures 80, 85, 90.

Figure 7A:
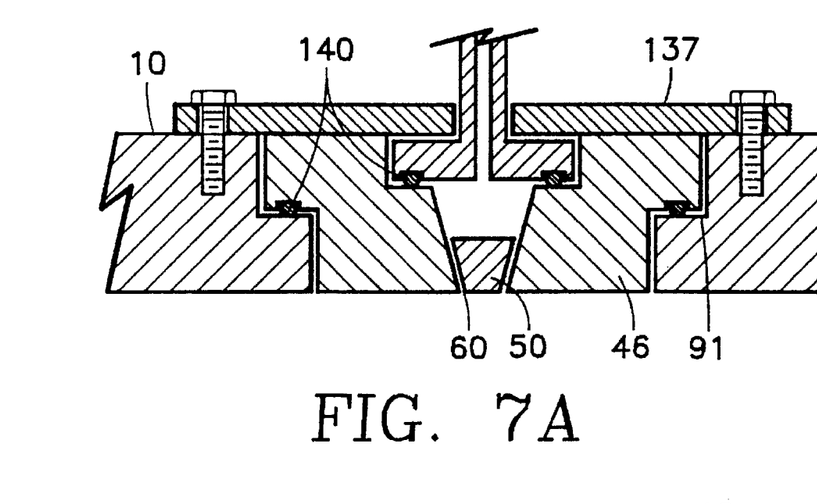
FIG. 7A is an enlarged cross-sectional view of a top-inserted version of a single slot "in-lid" embodiment of the invention corresponding to FIG. 1C.

FIG. 7A is an enlarged view of an embodiment which, like that of FIG. 1C, has a single slotted aperture 60, and is contained entirely within the lid 10, thereby eliminating any need for an attached floor (such as the floor 100 of FIG. 4A) and presenting a flush surface toward the interior of the reactor chamber, a significant advantage. The embodiment of FIG. 7A is a modular self-aligning assembly and requires fewer parts. Each element of the assembly is polished prior to assembly. Also, the liner element 46 is supported by a ledge 91 machined around an opening through the lid 10, which allows installation without removing the lid 10, makes sealing easier, and can more easily accommodate the pressure differential between ambient and the vacuum chamber. Furthermore, the embodiment of FIG. 7A requires no fasteners on the chamber side of the sealing surfaces. A significant advantage is that the modular construction of the gas distribution apparatus of FIG. 7A requires no drilling of gas passage holes, even though it succeeds in providing gas flow nozzles or slotted apertures with a width less than the plasma sheath thickness. In the absence of any necessity of drilling small holes, crystalline materials such as quartz or sapphire may be employed, if desired. Such crystalline materials, if chosen, are highly suitable in corrosive gas environments.

Figure 7B:
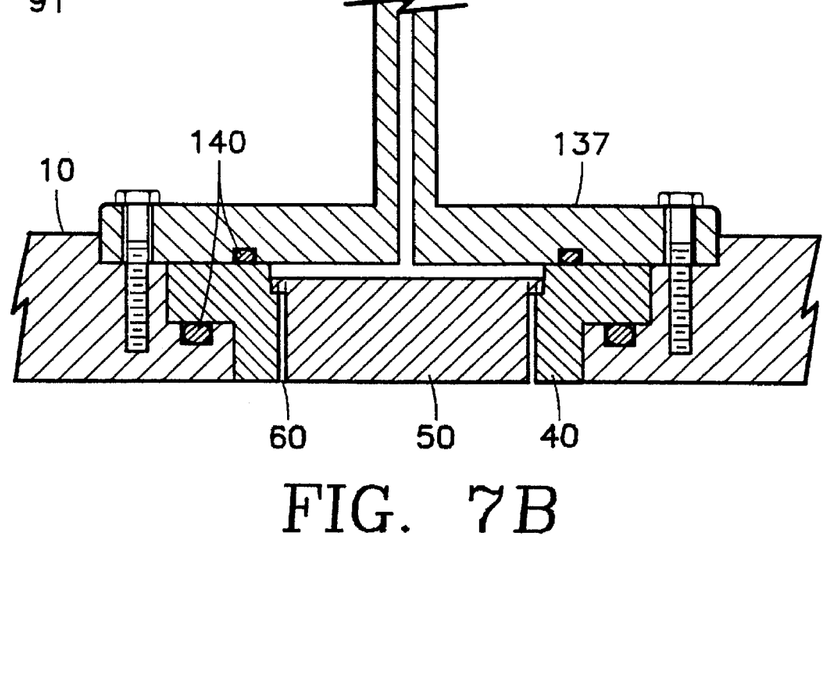
FIG. 7B is an enlarged cross-sectional view of a top-inserted version of a single slot "in-lid" embodiment of the invention corresponding to FIG. 1D.

FIG. 7A shows how the gas distribution apparatus is bolted with an exterior mounting ring 137 to the lid 10 and how O-ring seals 140 are employed to block gas flow along undesirable paths. The slotted aperture 60 is between about 20–30 mils wide. FIG. 7B is an enlarged view of one implementation of the embodiment of FIG. 7A, having a vertical gas exit flow (slotted aperture 60). FIG. 7B is also a preferred embodiment.

Figure 7C:
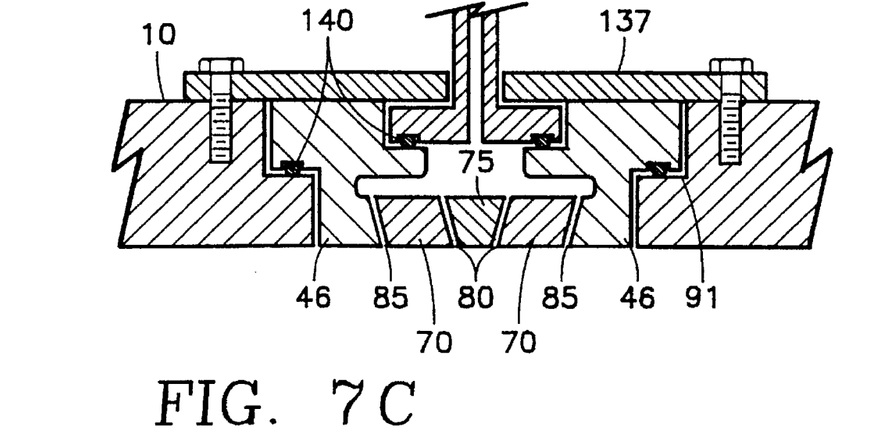
FIG. 7C is a cross-sectional view of a two-slit version of the embodiment of FIG. 7A.

FIG. 7C is a cross-sectional view of a two-slit version of the embodiment of FIG. 7A and employs the truncated conical center disk 75 and truncated conical annulus 70 of FIG. 4A to form the two slotted apertures 80, 85 extending at an angle relative to the axis of symmetry.

Figure 7D:
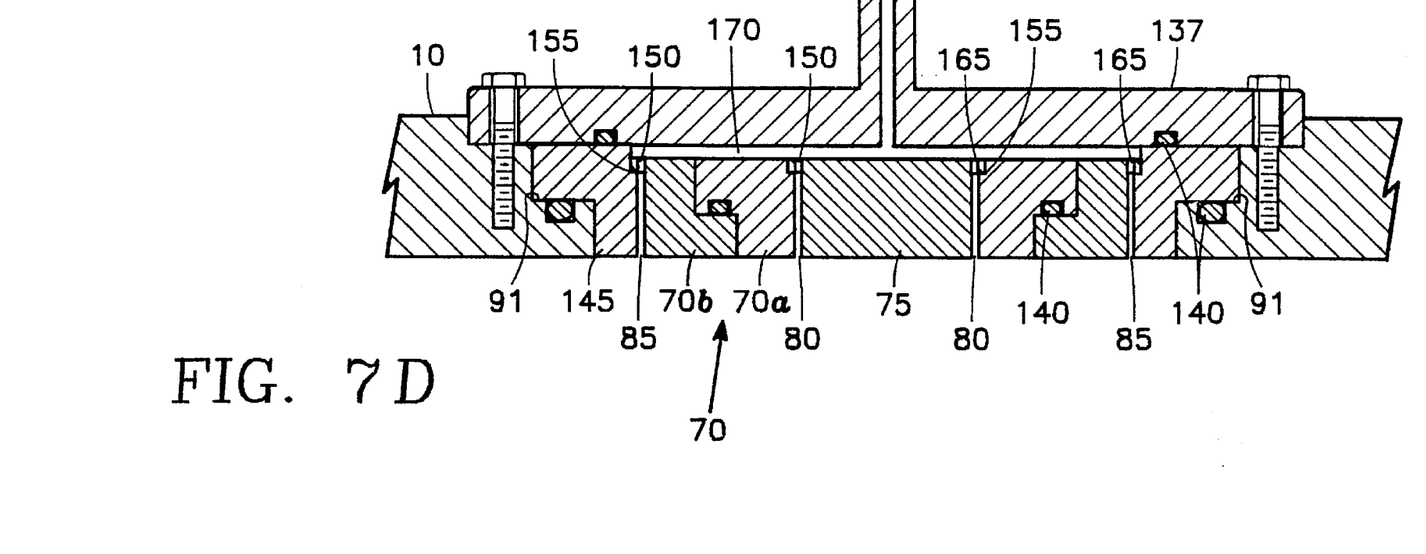
FIG. 7D is a cross-sectional view of a two-slit version of the embodiment of FIG. 7B.

FIG. 7D is a cross-sectional view of a two-slit version of the embodiment of FIG. 7B, in which the disk 75 and annular member 70 are cylindrical and are each contained within the lid 10, the inner and outer slotted apertures 80, 85 extending vertically or parallel to the axis of symmetry of the disk and annulus 75, 70. An outer ring 145 surrounds the outer slotted aperture 85. The annular member 70 of FIG. 7D comprises a pair of annular members 70a, 70b. In a preferred implementation, the pair of annular members 70, 70b may be formed as a single integral member, eliminating the seal between them. In the embodiment of FIG. 7D, the outer ring 145 is L-shaped so that it rests on the ledge 91. The annulus 70 (70b) has plural circumferentially spaced ears 150 extending radially outwardly from its outer circumference and nesting in a ledge in the inner circumference of the outer ring 145, the ears 150 there supporting the annulus 70. The ears 150 on the annulus transfer the weight of the annulus 70 to the outer ring 145. Likewise, the center disk 75 is supported by plural circumferentially spaced ears 150 extending from its outer circumference and nesting in slots 155 in the annulus 70. The spaced ears 150 form gaps 165 (illustrated in FIG. 7G) therebetween so that the ears 150 do not prevent gas flow through the gas flow passages 80, 85. (It should be noted that the feature of the ears 150 nesting in slots 155 described here with reference to FIG. 7D is also employed in the embodiment of FIG. 7B.) Conventional o-rings 140 provide seals to restrict gas flow to the slotted apertures 80, 85 and maintain vacuum integrity for the chamber. A gas manifold 170 formed between the mounting ring 137 and the top surfaces of the gas distribution hardware receives gas from the gas inlet supply passage 275, the gas flowing out of the manifold 170 through the slotted apertures 80, 85 to the interior of the reactor chamber. In a preferred implementation of the embodiment of FIG. 7D, the annular members 70a, 70b, the disk 75 and the outer ring 145 may be polyimide but are preferably ceramic and about 1.2 cm thick. The lid 10 was formed of aluminum anodized on the bottom surface facing the reactor chamber. In general, the structure defining the slotted apertures, including the annular members 70, disk 75 and ring 145 may be formed of any of the following materials: ceramic, quartz, sapphire, polyimide and anodized aluminum. The flange or mounting ring 137 was formed of stainless steel and the O-rings 140 were of a conventional type suitable for use with corrosive gases. The combination of stainless steel mounting ring 137/supply passage 275 and ceramic or quartz slotted apertures 80, 85 provides a gas distribution structure having no aluminum and which is therefore much more resistant to attack from corrosive gases. The slotted apertures 80, 85 were 0.5 mm gaps.

Figures 7E, 7F, 7G:
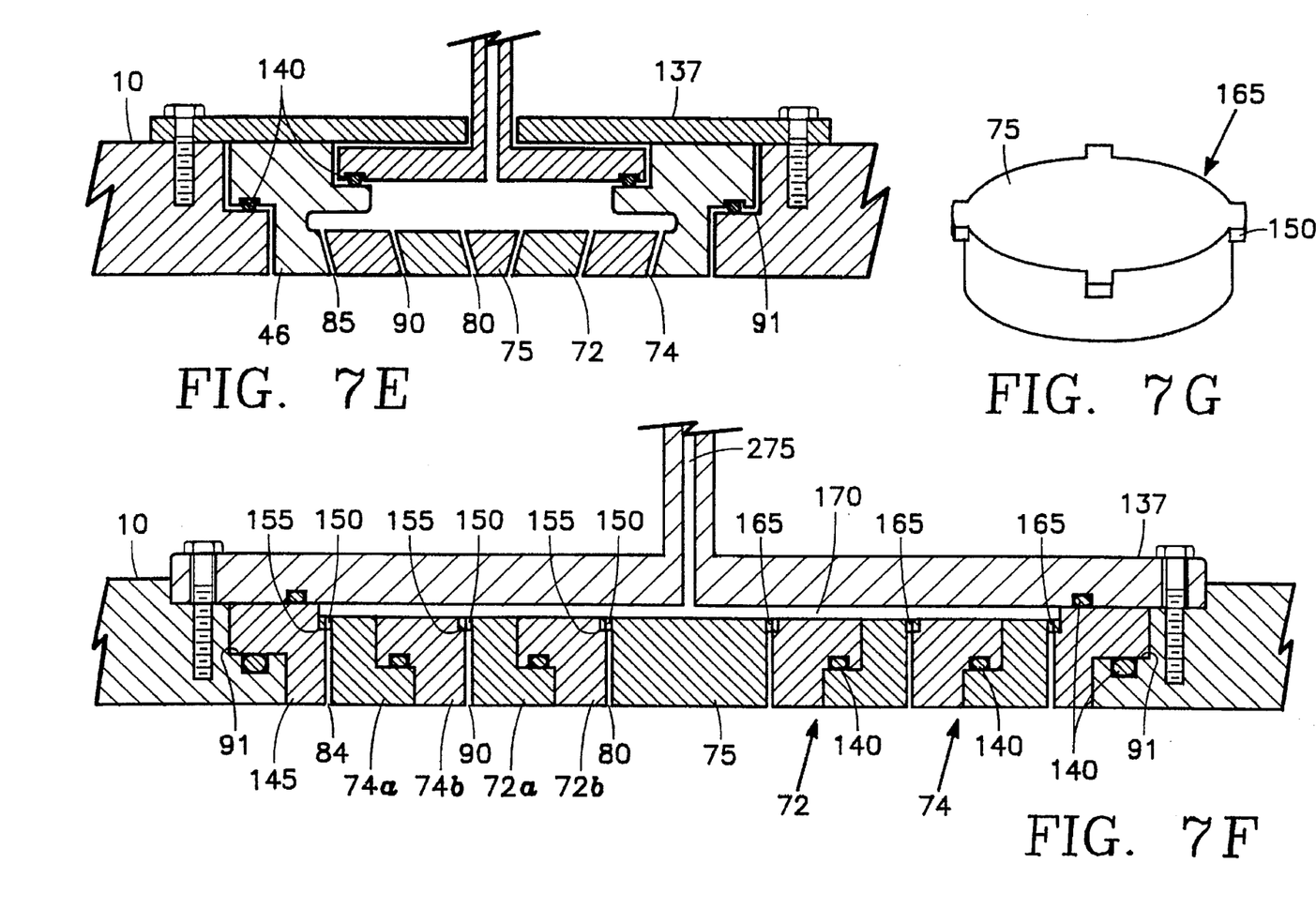
FIG. 7E is a cross-sectional view of a three-slit version of the embodiment of FIG. 7C.
FIG. 7F is a cross-sectional view of a three-slit version of the embodiment of FIG. 7D.
FIG. 7G is a perspective view of a central disk of the blocking plate assembly in the embodiment of FIG. 7D.

FIG. 7E illustrates a three-slot version of the embodiment of FIG. 7C and is identical in most respects with the exception of the replacement of the annular member 70 with the inner and outer annular members 72, 74. FIG. 7F illustrates a three-slot version of the embodiment of FIG. 7D and is identical in most respects with the exception of the replacement of the annular members 70a, 70b with the inner and outer annular members 72a, 72b, 74a, 74b. The pair of annular members 72a and 72b may be combined as a single integral member (eliminating the seal between them) and, similarly, the pair of annular members 74a, 74b may be combined as a single integral member.

The embodiment of FIG. 7B has been tested in a production environment. Approximately 12,000 six-inch diameter wafers were processed using a ceramic version of the embodiment of FIG. 7B, after which the plasma reactor chamber showed no signs of significant particle contamination increase, particle contamination levels remaining within acceptable process limits. Visual inspection of the slit nozzle parts showed no signs of degradation or wear due to exposure to the corrosive etch chemistry. Furthermore, the anodized chamber side of the lid surrounding the slit nozzle showed no signs of wear or corrosion. In comparison, for chambers equipped with a conventional gas distribution plate, the gas distribution plate typically shows enough wear or degradation to require replacement after processing of only 5,000 wafers. This comparison demonstrates the longer life and lower cost of consumable materials realized in the present invention relative to conventional gas distribution plates currently employed in typical plasma reactor chambers.

Figure 8:
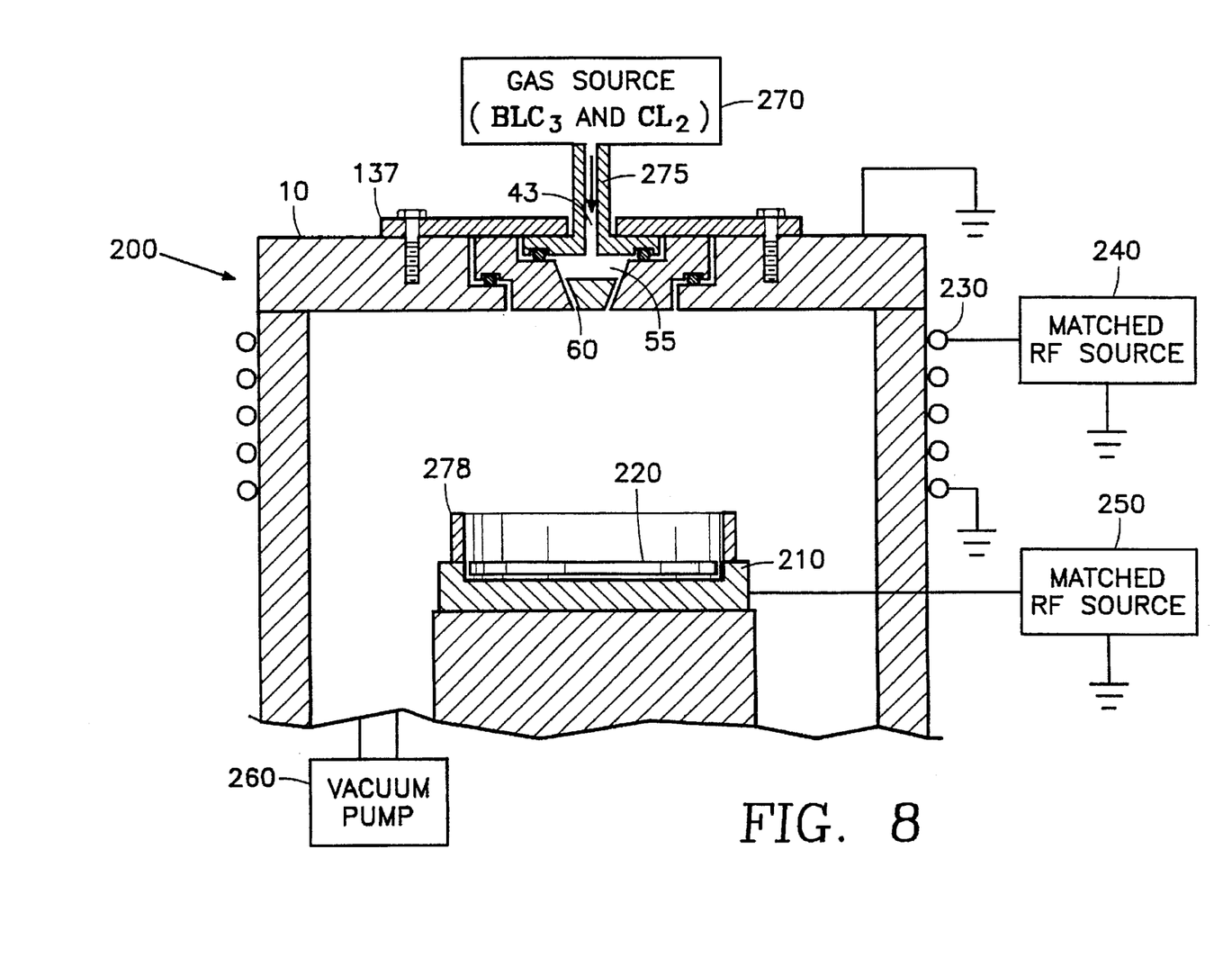
FIG. 8 is a cross-sectional view of nearly an entire plasma reactor in which the embodiment of FIG. 7A is installed.

FIG. 8 illustrates a plasma reactor having the gas distribution apparatus of FIG. 7A. The lid 10 is part of a cylindrical chamber housing 200 containing a wafer pedestal 210 supporting a semiconductor wafer 220 which is to be processed. An RF coil antenna 230 wrapped around the reactor chamber housing 200 is powered by a matched RF source 240, constituting the plasma source power. A bias RF power source 250 controlling the ion bombardment energy is connected to the wafer pedestal 210. However, other RF power source configurations may be employed. For example, a magnetically enhanced reactive ion etch apparatus can be employed in which the RF antenna coil and RF source are replaced with electromagnetic coils and the RF power is input only to the wafer pedestal 210. A vacuum pump 260 and throttle valve (not shown) control the chamber interior gas pressure. A gas supply 270 is connected through a steel inlet tube 275 to the gas distribution manifold 55 of the gas distribution apparatus.

Figure 9:
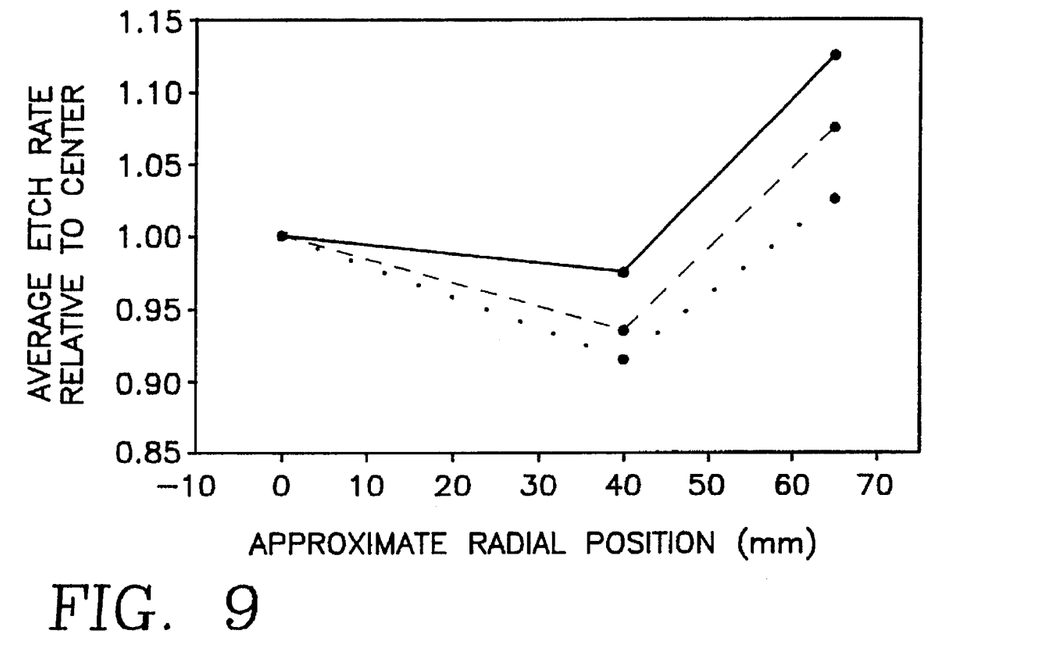
FIG. 9 is a graph illustrating etch rate uniformity across the wafer surface as a function of the diameter of the gas distribution slotted nozzle of FIG. 7B.

FIG. 9 illustrates how the diameter of the slotted aperture nozzle 60 of FIG. 7B can be varied to select a desired etch rate distribution across a 150 mm diameter wafer. FIG. 9 shows the average etch rate as a function of radial position normalized to the etch rate at the center of the wafer. The etch rate at the middle and edge increases relative to the center as the diameter of the slotted nozzle is increased from 2.5 cm (dotted line curve) to 3.3 cm (dashed line curve) and then to 3.7 cm (solid line curve). In an implementation corresponding to FIG. 6B but with a single circular slit, increasing the nozzle diameter from 1.8 cm, to 2.5 cm and then to 3.1 cm provided respective deviations in etch rate uniformity across the wafer diameter of 24%, 12% and 8%, respectively.

Figure 10:
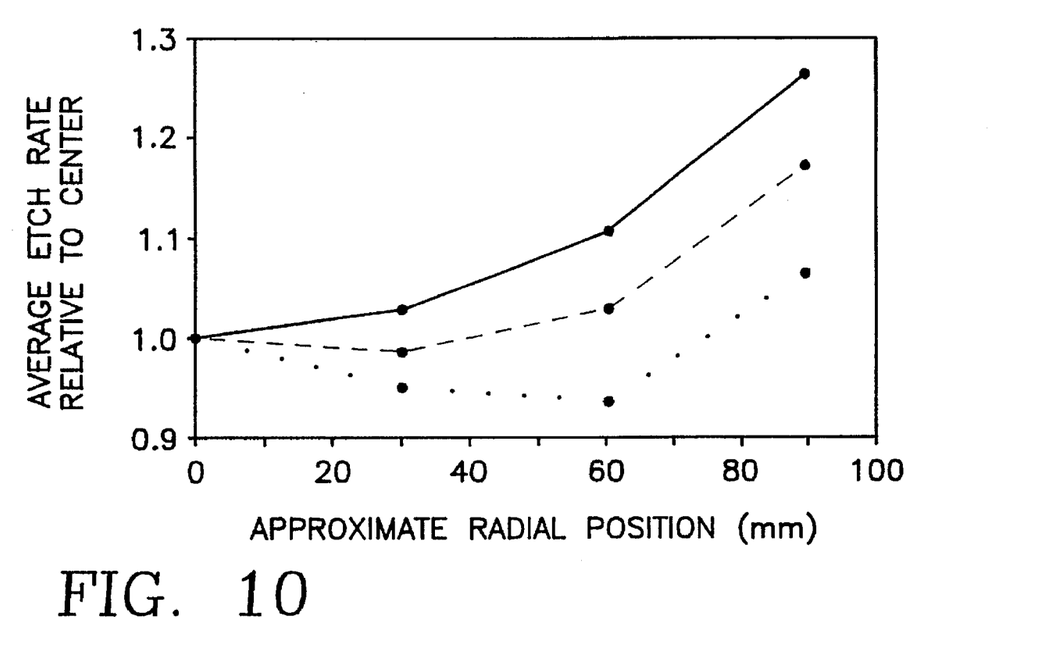
FIG. 10 is a graph illustrating the effect on etch rate uniformity across the wafer surface of the combination of plural slotted nozzles of different diameters.

FIG. 10 illustrates the etch rate distribution across a 200 mm diameter wafer for a double slit configuration. The data in FIG. 10 correspond to the embodiment of FIG. 7D. The slits 85, 80 were 4 inches (10 cm) and 1.5 inches (3.7 cm), respectively, in diameter. Three tests were performed by blocking, respectively, the 3.7 cm slit only (solid line curve), the 10 cm slit only (dotted line curve) and by blocking neither slit (dashed line curve). Consistent with FIG. 9, the etch rates at the middle and edge of the wafer increase relative to the center of the wafer as the slit diameter is increased. Furthermore, the etch rate distribution across the wafer with the double slit configuration lies between those for the single slit runs. In summary, the data of FIGS. 9 and 10 shows that the etch rate variation from center to the outer middle region of the wafer (i.e., from 0 to 40 mm radial position for 150 mm wafers and from 0 to 60 mm radial position for 200 mm wafers) can be minimized by adjusting the slit diameter(s). The present invention provides etch rate uniformity on a par with that of conventional gas distribution apparatus while providing far greater advantages in resistance to corrosion and ease of assembly, as will be discussed below.

Figure 11:
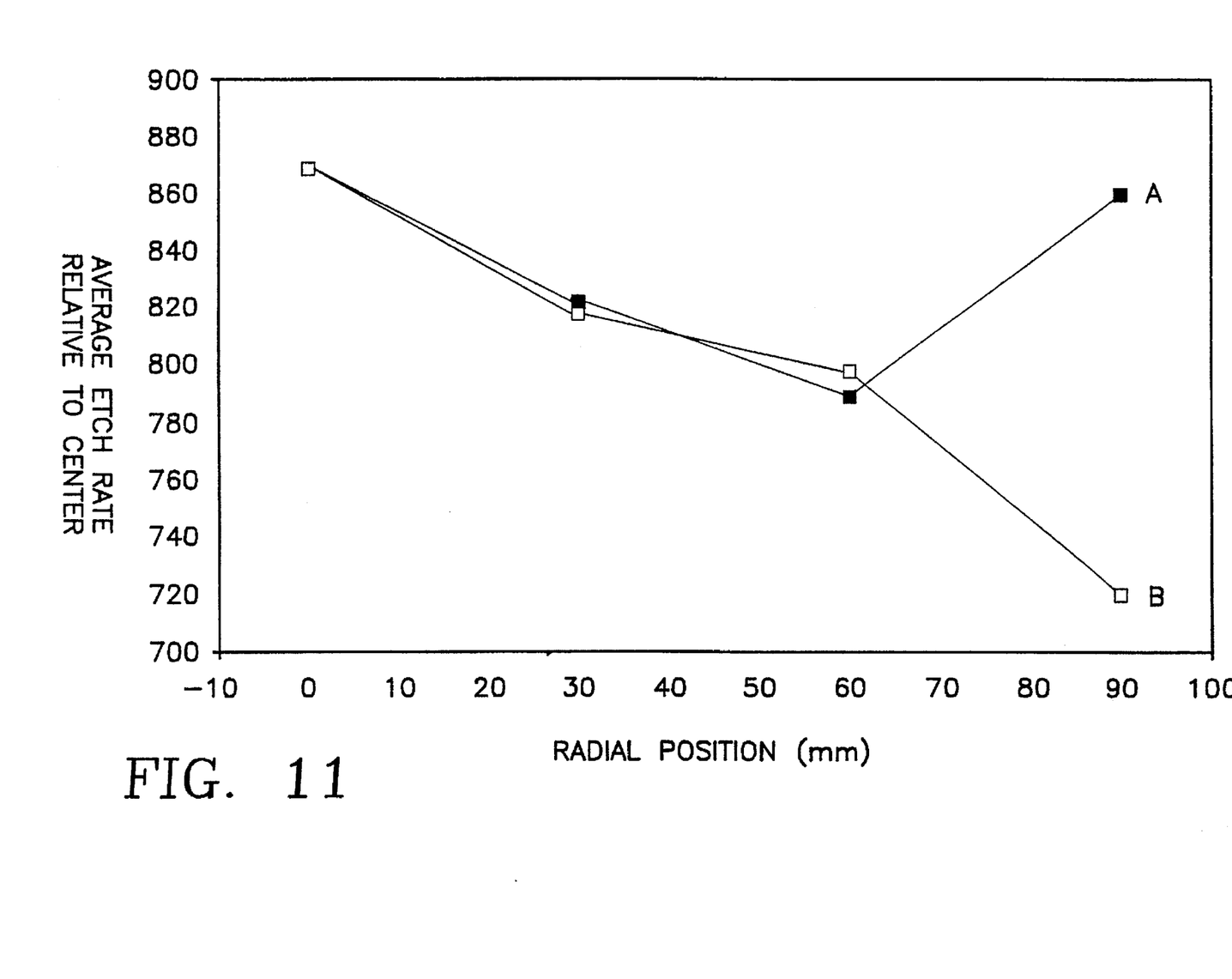
FIG. 11 is a graph comparing etch rates across the wafer surface with the focus ring (white square curve) and without the focus ring (black square curve).

Referring again to FIG. 8, in order to decrease or control the etch rate near the wafer periphery, a focus ring 278 may be added surrounding the wafer periphery. The focus ring reduces the flow of etchant species across the chemical boundary separating the plasma region over the wafer center having a scarcity of etchant species ions and the plasma region beyond the wafer periphery having a plentitude of etchant species ions. FIG. 11 illustrates how the addition of the focus ring reduces the etch rate near the periphery of a 200 mm diameter wafer from a high rate of about 860 nm/min (black square curve) to a low rate of about 720 nm/min (white square curve). The fact that the focus ring strongly modulates the etch rate at the wafer periphery implies that etch rate variation across the wafer can be minimized by judicious selection of nozzle diameter(s) combined with focus ring height.

Overall, etch rate uniformity comparable to that achieved with conventional gas distribution plates has been demonstrated with the present invention, while providing far greater advantages in resistance to corrosion. As mentioned hereinabove, conventional gas distribution plate are typically designed with more orifices per unit area over the wafer center to enhance the etch rate at the wafer center. An advantage of the present invention is that, despite having a very small number of slotted aperture nozzles (compared to the large number of small orifices in a conventional gas distribution plate), it inherently delivers sufficient gas over the center of the wafer to achieve the same etch rate uniformity.

Figure 12:
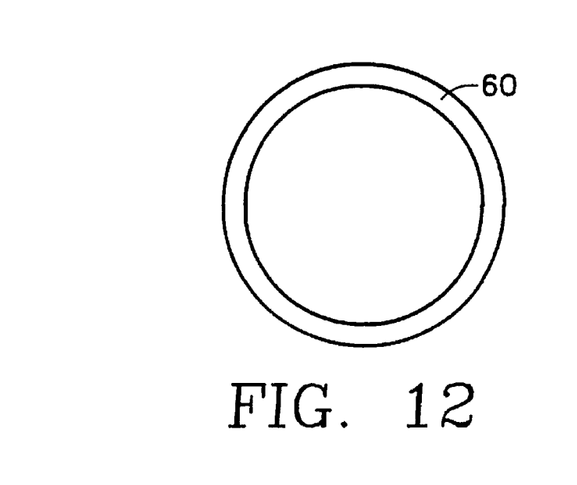
FIG. 12 is a bottom view of a circular slotted nozzle in accordance with one aspect of the invention.
Figure 13:
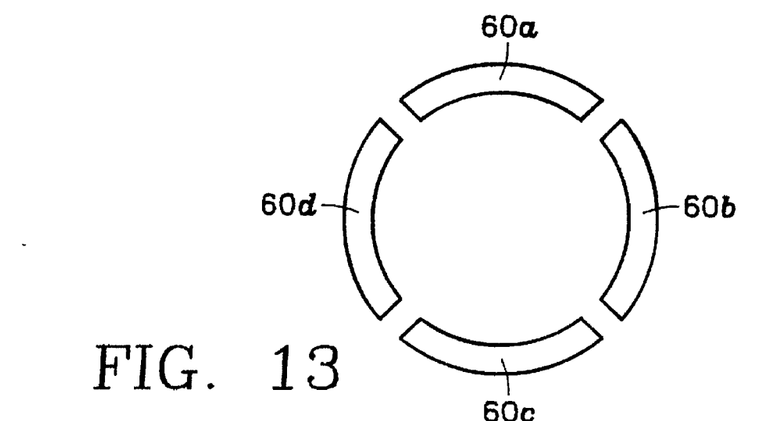
FIG. 13 is a bottom view of a slotted nozzle in accordance with a further aspect of the invention consisting of plural discrete arcuate sections.
Figure 14:
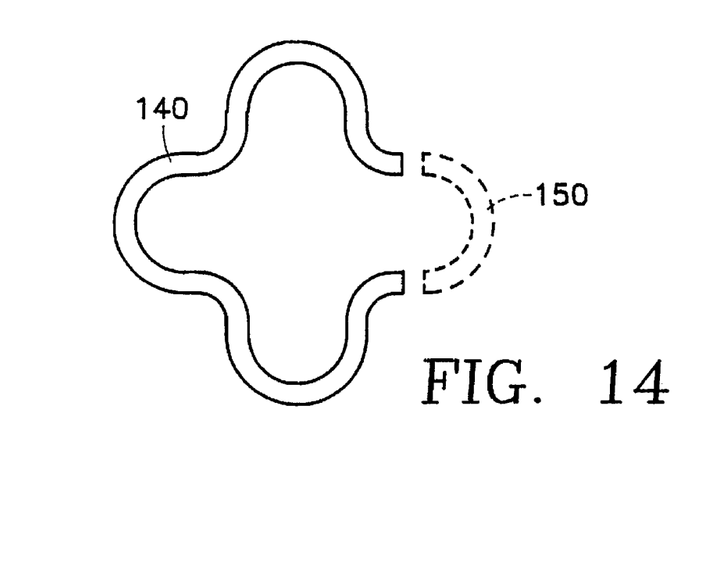
FIG. 14 is a bottom view of a slotted nozzle in accordance with a yet further aspect of the invention having a meandering curved shape divisible into plural arcuate sections.
Figure 15:
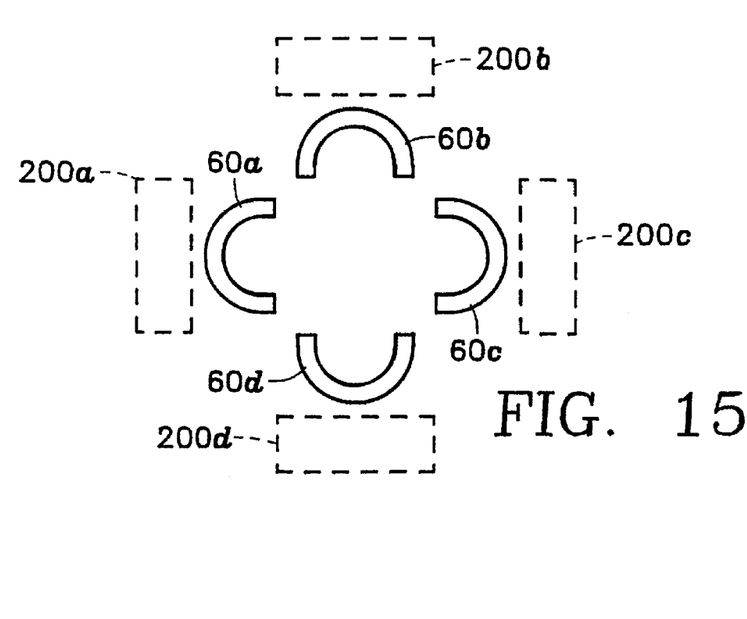
FIG. 15 illustrates how the slotted nozzle of FIG. 14 may be segmented and how the segments may be oriented relative to external magnets of an ER-RIE plasma reactor.

FIG. 12 is a bottom view of the circular slotted aperture nozzle 60 of FIG. 1C. FIG. 13 illustrates how the nozzle 60 may be segmented into discrete arcuate sub-sections 60a–60d, while FIG. 14 illustrates how the nozzle 60 can follow a meandering arcuate path 140 having a portion 150 thereof deleted, rather than a circular path. FIG. 15 illustrates how the embodiment of FIG. 14 can be segmented into separate arcuate sub-sections. The embodiments of FIGS. 13–15 could be useful for applications in magnetically enhanced reactive ion etch (ME-RIE) reactors in which the corners between adjacent external magnets of the reactor have somewhat higher magnetic fields and therefore higher etch rates with a uniform etchant gas distribution. This non-uniformity can be compensated by aligning the gaps between adjacent sections 60a–60d of the slotted aperture nozzle 60 over the regions of high magnetic field density. In the case of an ME-RIE plasma reactor, such an alignment is shown in FIG. 15 by indicating in dashed line the relative orientation of the four external magnets 200a–200d of the reactor with reference to the four discrete nozzle sections 60a–60d. It is currently felt that such fine tuning of etch rate uniformity is not necessary.

In the embodiments of FIGS. 1C, 1D, 7A and 7B employing a single slotted aperture 60, the aperture diameter is generally in the broad range of 0.5 inches (1.2 cm) to 6.0 inches (15 cm), although the preferred range is 1.0 inches (2.5 cm) to 2.0 inches (5.0 cm). In the embodiments of FIGS. 4A, 4B, 7C and 7D employing a pair of slotted apertures 80, 85, the outer slotted aperture diameter is generally in the broad range of 3.0 inches (7.5 cm) to 6.0 inches (15 cm) with the preferred diameter being about 4.0 inches (10 cm), and the inner slotted diameter is generally in the broad range of 0.5 inches (1.2 cm) to 2.0 inches (5.0 cm) with the preferred diameter being about 1.5 inches (3.7 cm). In the embodiments of FIGS. 6A, 6B, 7E and 7F employing three slotted apertures 80, 90, 85, the aperture diameters in one example may be on the order of about 0.3 inch (0.8 cm), 1.0 inch (2.5 cm) and 1.25 inches (3.0 cm), respectively, or, alternatively, 4 inches (10 cm), 2.5 inches (6.3 cm) and 1 inch (2.5 cm), respectively.

Advantages of the Invention:

The invention provides a combination of advantages over conventional gas distribution plates. Because it is a modular assembly with separate pieces forming elongate apertures or nozzles with a gap not exceeding the plasma sheath thickness, the separate pieces are polished externally so that no surface imperfections can contribute to degradation or particle contamination in a corrosive gas environment. Moreover, the absence of any drilled holes permits the use of any corrosive-resistant materials including quartz or sapphire as well as ceramics, which, in combination with a stainless steel gas inlet, provides a gas distribution apparatus virtually impervious to attack from corrosive gases. The modular design provides drop-in self-aligning assembly for ease of manufacture. Despite the small number of nozzles compared with conventional gas distribution plates, the invention achieves comparable etch rate uniformity and design versatility while at the same time providing cycle lifetime many times that of conventional gas distribution plates. This in turn provides greater throughput by reducing frequency of production down-time for replacing consumable materials.

While the invention has been described in detail by specific reference to preferred embodiments thereof, it is understood that variations and modifications thereof may be made without departing from the true spirit and scope of the invention.

What is claimed is:

1. A plasma reactor comprising:
   a reactor vacuum chamber having a chamber housing;
   a pedestal holding a workpiece to be processed
   gas injection apparatus, comprising:
      a gas supply containing a processing species in a gas,
      an opening in said chamber housing,
      a gas feed line from said supply to said opening in said chamber housing,
      gas distribution apparatus near said opening in said chamber housing, comprising:
         a disk member surrounded by an annular member with a gap therebetween, said gap comprising an elongate thin slit nozzle facing the interior of said chamber, said disk member and annular member dispersing gas flow from said opening in said chamber housing to said slit nozzle, and
         a plurality of spacers, each disposed between the disk member and the annular, said spacers having a thickness which spans the gap between the disk and annular members and causes said gap to be of a substantially equal width over its entire circumference, said spacers further having a cross-sectional size in the direction of gas flow which is sufficiently small so as to not significantly interfere with the flow of gas from the slit nozzle.

2. The reactor of claim 1 wherein said gas distribution apparatus is contained within said opening in said chamber housing.

3. The reactor of claim 1 wherein said gas distribution apparatus is suspended inside said chamber adjacent said opening in said chamber housing.

4. The reactor of claim 1 further comprising an intermediate annular member surrounding said annular member and separated therefrom by a gap therebetween comprising a second slit nozzle.

5. The reactor of claim 4 further comprising an outer annular member surrounding said intermediate annular member and separated therefrom by a gap therebetween comprising an outer slit nozzle.

6. The reactor of claim 1 wherein said disk member and said annular member are cylindrical and concentric with one another.

7. The reactor of claim 1 wherein said disk member and said annular member are each mutually congruent truncated conical sections.

8. The reactor of claim 7 wherein said conical sections correspond to a cone whose apex faces toward the center of said workpiece, whereby each slit nozzle directs gas flowing therethrough toward said center of said workpiece.

9. The reactor of claim 5 wherein said disk member and each of said annular members are mutually congruent truncated conical sections.

10. The reactor of claim 9 wherein said conical sections correspond to a cone whose apex faces toward the center of said workpiece, whereby each slit nozzle directs gas flowing therethrough toward said center of said workpiece.

11. The reactor of claim 1 wherein each of said members of said gas distribution apparatus comprises a material substantially impervious to attack from said processing species.

12. The reactor of claim 11 wherein said processing species comprises at least one of (a) chlorine and (b) boron tri-chloride.

13. The reactor of claim 11 wherein said material substantially impervious to attack from said processing species comprises one of: (a) ceramic, (b) quartz, (c) sapphire, (d) polyimide, (e) anodized aluminum.

14. The reactor of claim 1 further comprising a focus ring adjacent said pedestal surrounding a peripheral edge of said workpiece.

15. The reactor of claim 11 wherein said gas feed line comprises stainless steel and wherein each of said members of said gas distribution apparatus comprises one of: (a) ceramic, (b) quartz, (c) sapphire, (d) polyimide, (e) anodized aluminum.

16. The reactor of claim 1 wherein said disk and annular members have their surfaces polished prior to assembly of said gas distribution apparatus.

17. The reactor of claim 1 wherein said slit nozzle follows a closed circular path.

18. The reactor of claim 1 wherein said chamber housing comprises a lid overlying said workpiece and having a ceiling surface thereof facing said workpiece, and wherein said opening through said chamber housing is in said lid.

19. The reactor of claim I wherein said slit nozzle has a diameter in the range of approximately 0.5 inches (1.2 cm) to 6.0 inches (15 cm).

20. The reactor of claim 19 wherein said slit nozzle has a diameter in the range of 1.0 inches (2.5 cm) to 2.0 inches (5.0 cm).

21. The reactor of claim 4 wherein said second slit nozzle has a diameter in the range of 3.0 inches (7.5 cm) to 6.0 inches (15 cm) and said slit nozzle has a diameter in the range of approximately of 0.5 inches (1.2 cm) to 2.0 inches (5.0 cm).

22. The reactor of claim 21 wherein said second slit nozzle and said slit nozzle have diameters of about 4.0 inches (10 cm) and about 1.5 inches (3.7 cm), respectively.

23. The reactor of claim 5 wherein said slit nozzle, said second slit nozzle and said outer slit nozzle have diameters of about one of:

(a) 0.3 inch (0.8 cm), 1.0 inch (2.5 cm) and 1.25 inches (3.0 cm), respectively, and (b) 4 inches (10 cm), 2.5 inches (6.3 cm) and 1 inch (2.5 cm), respectively.

24. The reactor of claim 1, wherein the each one of the plurality of spacers is disposed at approximately equal intervals from one another around the circumference of the gap.

25. The reactor of claim 24 wherein said plurality of spacers number at least three.

26. The reactor of claim 4 wherein the annular member and the intermediate annular member disperse gas flowing from said opening in said chamber housing to the second slit nozzle, and wherein said gas distribution apparatus further comprises:

a plurality of spacers, each disposed between the annular member and the intermediate annular at approximately equal intervals from one another, said spacers having a thickness which spans the gap between the annular member and the intermediate annular and causes said gap to be of a substantially equal width over its entire circumference.

27. The reactor of claim 5 wherein the intermediate annular member and the outer annular member disperse gas flowing from said opening in said chamber housing to the outer slit nozzle, and wherein said gas distribution apparatus further comprises:

a plurality of spacers, each disposed between the intermediate annular member and the outer annular member at approximately equal intervals from one another, said spacers having a thickness which spans the gap between the intermediate annular member and the outer annular member and causes said gap to be of a substantially equal width over its entire circumference.

28. The reactor of claim 1 wherein said chamber housing comprises a lid overlying said workpiece and having a ceiling surface thereof facing said workpiece, and wherein said opening through said chamber housing is in said lid, and wherein said disk member and said annular member are both contained within said opening and have respective bottom surfaces co-planar with said ceiling surface of said lid.

29. The reactor of claim 4 wherein said chamber housing comprises a lid overlying said workpiece and having a ceiling surface thereof facing said workpiece, and wherein said opening through said chamber housing is in said lid, and wherein said disk member, said annular member and said intermediate annular member are contained within said opening and have respective bottom surfaces co-planar with said ceiling surface of said lid.

30. The reactor of claim 5 wherein said chamber housing comprises a lid overlying said workpiece and having a ceiling surface thereof facing said workpiece, and wherein said opening through said chamber housing is in said lid, and wherein said disk member, said annular member, said intermediate annular member and said outer annular member are contained within said opening and have respective bottom surfaces co-planar with said ceiling surface of said lid.

31. A gas distribution apparatus for injecting gases into a plasma reactor vacuum chamber comprising:

a disk member surrounded by an annular member with a gap therebetween, said gap comprising an elongate thin slit nozzle facing the interior of said chamber, said disk member and annular member dispersing gas to said slit nozzle, and a plurality of spacers, each disposed between the disk member and the annular member, said spacers having a thickness which spans the gap between the disk and annular member and causes said gap to be of a substantially equal width over its entire circumference, said spacers further having a cross-sectional size in the direction of gas flow which is sufficiently small so as to not significantly interfere with the flow of gas from the slit nozzle.

32. The gas injection apparatus of claim 31 further comprising an intermediate annular member surrounding said annular member and separated therefrom by a gap therebetween comprising an second slit nozzle.

33. The gas injection apparatus of claim 32 further comprising an outer annular member surrounding said intermediate annular member and separated therefrom by a gap therebetween comprising an outer slit nozzle.

34. The gas injection apparatus of claim 31 wherein said disk member and said annular member are cylindrical and concentric with one another.

35. The gas distribution apparatus of claim 31 wherein said disk member and said annular member are each mutually congruent truncated conical sections.

36. The gas injection apparatus of claim 35 wherein said conical sections correspond to a cone whose apex faces toward the center of said workpiece, whereby each slit nozzle directs gas flowing therethrough toward said center of said workpiece.

37. The gas injection apparatus of claim 33 wherein said disk member and each of said annular members are mutually congruent truncated conical sections.

38. The gas injection apparatus of claim 37 wherein said conical sections correspond to a cone whose apex faces toward the center of said workpiece, whereby each slit nozzle directs gas flowing therethrough toward said center of said workpiece.

39. The gas injection apparatus of claim 31 wherein each of said members of said gas distribution apparatus comprises a material substantially impervious to attack from said etchant species.

40. The gas injection apparatus of claim 39 wherein said etchant species comprises at least one of (a) chlorine and (b) boron trichloride.

41. The gas injection apparatus of claim 39 wherein said material substantially impervious to attack from said etchant species comprises one of: (a) ceramic, (b) quartz, (c) sapphire, (d) polyimide, (e) anodized aluminum.

42. The gas injection apparatus of claim 39 wherein said gas feed line comprises stainless steel and wherein each of said members of said gas distribution apparatus comprises one of: (a) ceramic, (b) quartz, (c) sapphire, (d) polyimide, (e) anodized aluminum.

43. The gas injection apparatus of claim 31 wherein said disk and annular members have their surfaces polished prior to assembly of said gas distribution apparatus.

44. The gas injection apparatus of claim 31 wherein said slit nozzle follows a closed circular path.

45. The gas injection apparatus of claim 31 wherein said slit nozzle has a diameter in the range of approximately 0.5 inches (1.2 cm) to 6.0 inches (15 cm).

46. The gas injection apparatus of claim 45 wherein said slit nozzle has a diameter in the range of 1.0 inches (2.5 cm) to 2.0 inches (5.0 cm).

47. The gas injection apparatus of claim 32 wherein said second slit nozzle has a diameter in the range of 3.0 inches (7.5 cm) to 6.0 inches (15 cm) and said slit nozzle has a diameter in the range of approximately 0.5 inches (1.2 cm) to 2.0 inches (5.0 cm).

48. The gas injection apparatus of claim 47 wherein said second slit nozzle and said slit nozzle have diameters of about 4.0 inches (10 cm) and about 1.5 inches (3.7 cm), respectively.

49. The gas injection apparatus of claim 33 wherein said slit nozzle, said second slit nozzle and said outer slit nozzle have diameters of about one of:

(a) 0.3 inch (0.8 cm), 1.0 inch (2.5 cm) and 1.25 inches (3.0 cm), respectively, and (b) 4 inches (10 cm), 2.5 inches (6.3 cm) and 1 inch (2.5 cm), respectively.

50. A reactor chamber for use with a source of process gas, comprising:

an interior capable of being evacuated, and provided with a channel to permit communication between a source of process gas and the interior of said chamber;

a pedestal adapted to mount a workpiece to be processed;

a gas injection device including, at least one solid central element adjacent and across the outlet of said channel, said central element being surrounded by one or more annular rings, said central element and each annular ring being closely spaced from one another to define one or more slit passageways centered about a central axis coinciding with that of said channel, said one or more slit passageways may be oriented to direct the process gas into said chamber interior one of (a) substantially perpendicularly of said pedestal, (b) angled inwardly and (c) angled outwardly of said central axis, and a plurality of spacers disposed within said one or more slit passageways between the solid central element and the one or more annular rings, said spacers having a thickness which spans the one or more slit passageways and causes them to be of a substantially equal width over their entire circumference, said spacers further having a cross-sectional size in the direction of gas flow which is sufficiently small so as to not significantly interfere with the flow of gas from the slit nozzle.

51. The chamber of claim 50, further including a focus ring mounted upon said pedestal and adapted to surround a workpiece to be processed and to extend above the position of said workpiece in a manner related to injection device diameter, whereby to improve process uniformity across said workpiece.

52. The chamber of claim 50 wherein said gas injection device comprises an insulating material, and said adjacent wall of said chamber comprises a conductive material.

53. The chamber of claim 50 wherein said gas injection device is recessed within the upper wall of said chamber.

54. The chamber of claim 50 wherein said central element is a disk whose diameter is at least an order of magnitude larger than the diameter of said channel.

55. The chamber of claim 50 wherein said central element is a cylindrical element whose diameter is greater than but within the same order of magnitude as the diameter of said channel.

56. The chamber of claim 53 wherein said gas injection device comprises an insulating material which is generally nonreactive in the plasma environment of the chamber interior.

57. The chamber of claim 50 wherein at least one of said one or more slit passageways is a continuous slit.

58. A plasma reactor for use with a source of process gas, comprising:
   a reactor chamber having an interior capable of being evacuated, and provided with a channel to permit communication between a source of process gas and the interior of said chamber;
   a pedestal adapted to mount a workpiece to be processed; and
   a gas injection device including,
      at least one solid central element adjacent and across the outlet of said channel, said element being surrounded by at least one annular member having a central axis of symmetry with a gap therebetween to define at least one slit passageway directing the gas toward said pedestal, said central and annular elements otherwise blocking gas flow from said channel into said chamber, and
      a plurality of spacers disposed within said at least one slit passageway, said spacers having a thickness which spans each slit passageway and causes it to be of a substantially equal width over its entire circumference, said spacers further having a cross-sectional size in the direction of gas flow which is sufficiently small so as to not significantly interfere with the flow of gas from the slit nozzle.

59. The reactor of claim 58 wherein each slit passageway is oriented to direct the process gas into said chamber interior in a direction substantially perpendicular of said pedestal.

60. The reactor of claim 58 wherein each slit passageway is oriented to direct the process gas into said chamber interior in a direction angled inwardly of said central axis.

61. The reactor of claim 58 wherein each slit passageway is oriented to direct the process gas into said chamber interior in a direction angled outwardly of said central axis.

62. A plasma reactor comprising:
   a reactor vacuum chamber having a chamber housing;
   a pedestal holding a workpiece to be processed;
   gas injection apparatus, comprising:
      a gas supply containing a processing species in a gas,
      an opening in said chamber housing,
      a gas feed line from said supply to said opening in said chamber housing,
      gas distribution apparatus near said opening in said chamber housing, said gas distribution apparatus having at least one elongate thin slit nozzle facing the interior of said chamber wherein said slit nozzle follows a segmented circular path so as to reduce gas flow over selected portions of said workpiece.

63. A plasma reactor comprising:
   a reactor vacuum chamber having a chamber housing;
   a pedestal holding a workpiece to be processed;
   gas injection apparatus, comprising:
      a gas supply containing a processing species in a gas,
      an opening in said chamber housing,
      a gas feed line from said supply to said opening in said chamber housing,
      gas distribution apparatus near said opening in said chamber housing, said gas distribution apparatus having at least one elongate thin slit nozzle facing the interior of said chamber wherein said slit nozzle follows a meandering arcuate path.

64. The reactor of claim 63 wherein said meandering arcuate path is segmented.

65. A plasma reactor comprising:
   a reactor vacuum chamber having a chamber housing;
   a pedestal holding a workpiece to be processed;
   gas injection apparatus, comprising:
      a gas supply containing a processing species in a gas,
      an opening in said chamber housing,
      a gas feed line from said supply to said opening in said chamber housing,
      gas distribution apparatus near said opening in said chamber housing, said gas distribution apparatus having a blocking plate in said chamber facing said opening through said chamber housing and separated from said chamber housing by a gap along a peripheral edge of said blocking plate, said gap comprising an elongate thin slit nozzle facing the interior of said chamber.

66. The reactor of claim 65 further comprising an annular gas reflector surrounding said blocking plate.

67. The reactor of claim 66 wherein said gas reflector comprises a reflector surface facing and acutely oriented relative to said blocking plate.

68. The reactor of claim 66 wherein said gas reflector comprises a reflector surface facing and obliquely oriented relative to said blocking plate.

69. A gas distribution apparatus for injecting gases into a plasma reactor vacuum chamber comprising:
   at least one elongate thin slit nozzle facing the interior of said chamber wherein said slit nozzle follows a segmented circular path so as to reduce gas flow over selected portions of said workpiece.

70. A gas distribution apparatus for injecting gases into a plasma reactor vacuum chamber comprising:
   at least one elongate thin slit nozzle facing the interior of said chamber wherein said slit nozzle follows a meandering arcuate path.

71. The reactor of claim 70 wherein said meandering arcuate path is segmented.

72. A reactor chamber for use with a source of process gas, comprising:
   an interior capable of being evacuated, and provided with a channel to permit communication between a source of process gas and the interior of said chamber;
   a pedestal adapted to mount a workpiece to be processed;
   an applicator for coupling RF energy into the chamber;
   a gas injection device including,
      at least one solid central element adjacent and across the outlet of said channel, said central element being surrounded by one or more annular rings, said central element and each annular ring being closely spaced from one another to define one or more slit passageways centered about a central axis coinciding with that of said channel, said one or more slit passageways may be oriented to direct the process gas into said chamber interior one of (a) perpendicularly of said pedestal, (b) angled inwardly and (c) angled outwardly of said central axis, and wherein
      at least one of said one or more slit passageways comprises an array of discrete slits.

73. The chamber of claim 71 wherein each array of discrete slits is symmetrically disposed relative to the central axis.

* * * * *